United States Patent [19]
Tokuno et al.

[11] Patent Number: 5,883,426
[45] Date of Patent: Mar. 16, 1999

[54] STACK MODULE

[75] Inventors: Kenichi Tokuno; Ikushi Morisaki; Akihiro Doya; Manabu Bonkohara; Naoji Senba; Yuuzou Shimada; Kazuaki Utumi, all of Tokyo, Japan

[73] Assignee: NEC Corporation, Tokyo, Japan

[21] Appl. No.: 844,320

[22] Filed: Apr. 18, 1997

[30]     Foreign Application Priority Data

Apr. 18, 1996   [JP]   Japan ................................. 8-096410

[51] Int. Cl.$^6$ ................................................. H01L 23/02
[52] U.S. Cl. ........................... 257/686; 257/713; 257/723
[58] Field of Search .................................... 257/713, 686, 257/685, 723

[56]           References Cited

U.S. PATENT DOCUMENTS 5,528,456   6/1996   Takahashi ............................... 257/713

FOREIGN PATENT DOCUMENTS 5-190712   7/1993   Japan .

OTHER PUBLICATIONS

Nobuaki Takahashi et al., "3–Dimensional Memory Module", NEC Corporation, Japan, pp. 1–7.

*Primary Examiner*—Peter Toby Brown
*Assistant Examiner*—Roy Potter
*Attorney, Agent, or Firm*—Young & Thompson

[57]            ABSTRACT

A stack module is provided which relieves thermal stress generated in a heat-radiating element and provides improved cooling efficiency. Connection bumps of a plurality of mounting substrates, onto which are mounted semiconductor chips are used to stack the substrates to four levels, three wave-shaped heat-radiating elements, made of copper, being in thermal contact between the semiconductor chips of three of the mounting substrates and the rear surfaces of three of the mounting substrates, making use of the spring elasticity of the heat-radiating elements to establish this thermal contact.

7 Claims, 4 Drawing Sheets

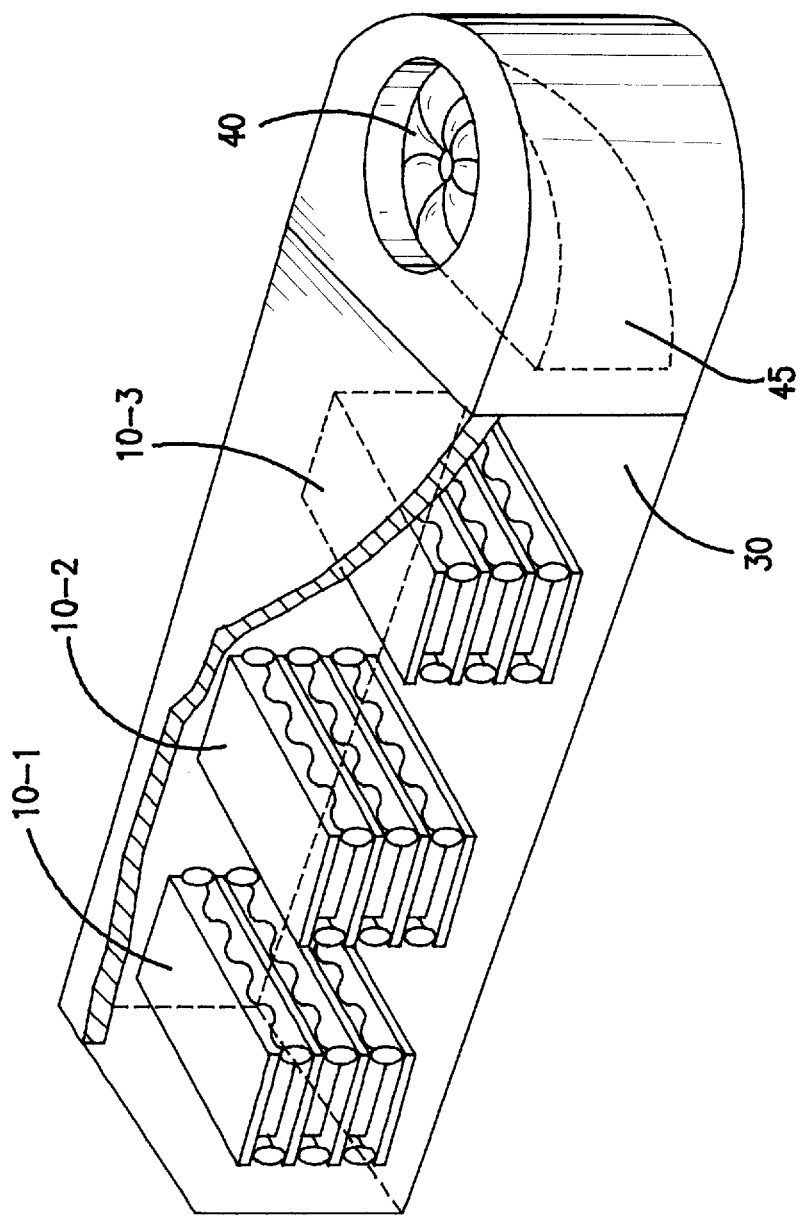

STACK MODULE

BACKGROUND OF THE INVENTION

1. Field of the Invention

The present invention relates to a stack module, and more specifically to a stack module in which a plurality of substrates onto which are installed a semiconductor chip are stacked.

2. Description of Related Art

FIG. 3 shows a cross sectional view of an example of a stack module in the related art.

In the stack module which is shown FIG. 3, a heatsink 8 is adhered to the top of (or the beneath of) a semiconductor chip 1 (or substrate 2), that rests on (or beneath) the substrate 2, and four of these combinations being stacked using a bump 6 for the purpose of connecting the substrate.

On the other hand, for example, in the Japanese Unexamined Patent Publication (KOKAI) No. 5-190712, discloses a semiconductor device in which a heatsink is directly connected to one main surface of a semiconductor chip but this reference fails to show or suggest to stack a plurality of this kind of semiconductor chips.

However, there is a drawback in the above-described stack module, because of the difference in coefficient of thermal expansion between the semiconductor chip (or substrate) and the heatsink, which causes thermal stress to develop at the above-noted adhered part, thereby shortening the thermal-cycle life.

Additionally, because the heatsink is a flat plate and has a small heat-radiating surface area, to increase the cooling effect, it is necessary to extend the heatsink to outside the bounds of the substrate, this making it difficult to achieve a compact stack module.

In view of the above-noted drawbacks in this related art, an object of the present invention is to provide a stack module which enables efficient cooling without the generation of thermal stress therewithin, thereby enabling long life of the stacked module.

SUMMARY OF THE INVENTION

To achieve the above-noted object of the present invention, a first aspect of the present invention has basically a following technical construction in that a stack module comprising a plurality of substrates on a main surface of which at least one semiconductor chip is mounted, and each one of the substrates being stacked each other, one by one, the stack module being provided with a wave-shaped heat-radiating element disposed between the semiconductor chip and an adjacent substrate arranged opposite to a surface of the semiconductor chip so that the heat-radiating element contacts both the surface of the semiconductor chip and the opposite surface of the adjacent substrate to the semiconductor chip.

And a second aspect of the present invention has basically a following technical construction in that a stack module comprising a plurality of substrates on a main surface of which at least one semiconductor chip is mounted, and each one of the substrates being stacked each other, one by one, the stack module being provided with a heat pipe element disposed between the semiconductor chip and an adjacent substrate arranged opposite to a surface of the semiconductor chip so that the heat pipe element contacts both the surface of the semiconductor chip and the opposite surface of the adjacent substrate to the semiconductor chip.

BRIEF DESCRIPTION OF THE DRAWINGS

FIG. 4 is a schematic view of a third embodiment of the stacked module in the present invention.

DETAILED DESCRIPTION OF THE INVENTION

The embodiments of the stack module of the present invention will be described below with reference being made to FIGS. 1, 2 and 4.

Figure 1:
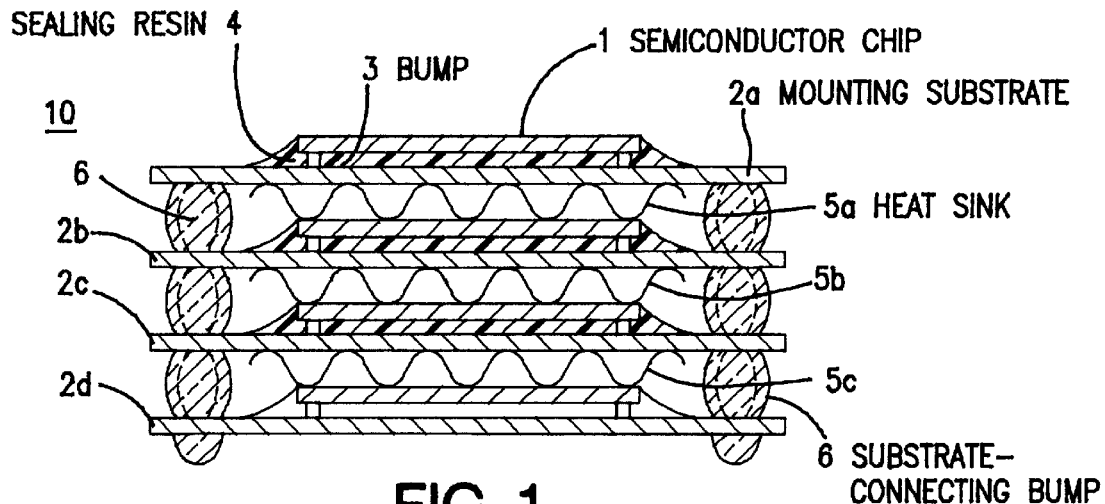
FIG. 1 is a cross-sectional view which shows the first embodiment of a stack module in the present invention.

FIG. 1 shows a cross-sectional view of a first embodiment of the stack module of the present invention, and in FIG. 1, it is disclosed that a stack module 10 comprising a plurality of substrates 2a to 2d on a main surface of which at least one semiconductor chip 1 is mounted, and each one of the substrates 2a to 2d being stacked each other, one by one, and the stack module 10 being provided with a wave-shaped heat-radiating element 5a to 5c disposed between the semiconductor chip 1 and an adjacent substrate 2a, 2b, 2c or 2d arranged opposite to a surface of the semiconductor chip 1 so that the heat-radiating element 5a to 5c contacts both the surface of the semiconductor chip 1 and the opposite surface of the adjacent substrate 2a, 2b, 2c or 2d to the semiconductor chip 1.

Note that the characteristic technical feature of the first embodiment of the present invention is such that the stack module 10 has a wave-shaped heat-radiating element 5a, 5b, and 5c, between a semiconductor chip 1 which is flip-chip mounted on a substrate 2a, 2b, 2c or 2d and the adjacent substrate 2a, 2b, 2c or 2d.

In the stack module 10 which is shown FIG. 1, connection bumps 6 of mounting substrates 2a through 2d, onto which are mounted semiconductor chips 1 are used to stack the substrates to four levels, wave-shaped heat-radiating elements 5a through 5c, made of copper, being in thermal contact between the semiconductor chips 1 of the mounting substrates 2b through 2d and the rear surfaces of the mounting substrates 2a through 2c, making use of the spring elasticity of the radiating elements to establish this thermal contact.

In the present invention, when the above-mentioned stack module 10 is formed, currently used soldering materials can be used for the connection bumps 6 and further a conductive metal, for example, copper balls, can be used accompanied by the soldering material as a core component.

The heat-radiating elements 5a through 5c, having a large heat-radiating surface area, have a large cooling effect and, because the heat-radiating elements 5a through 5c are not adhesively attached to any point, thermal stress is not generated.

In the first embodiment of the present invention, the semiconductor chip 1 can be mounted on one main surface of the mounting substrate 2a to 2d, utilizing any kinds of chip mounting method as currently known but the semiconductor chip 1 is preferably mounted on the substrate in a flip-chip mounting manner.

Further in the embodiment of the stack module of the present invention, the heat-radiating element 5a through 5c, are preferably have wave-like shape, as shown in FIG. 1, and moreover, in the present invention, it is very important that the wave-like shaped heat-radiating element 5a through 5c, should be directly connected to both the surface of the semiconductor chip 1 and the opposite surface of the substrate 2 to the chip 1 and the substrate 2, which is adjacently arranged to the chip.

Note that, in the present invention, the heat-radiating element 5a through 5c, have a large heat-radiating surface area, and thus they have a large cooling effect and, because the heat-radiating elements 5a through 5c are not adhesively attached to any point, thermal stress is not generated.

Further note that in the present invention, the heat-radiating element 5a through 5c, have a cushion effect so that even if the stack module was suffered from some physical stress including a thermal stress or the like, the heat-radiating element 5a through 5c can absorb such stress.

Moreover, in the present invention, the heat radiating effect will be much more improved since the heat-radiating element 5a through 5c, not only have relatively large surfaces, respectively, but also are connected to the oppositely arranged neighboured substrate so that the heat radiating operation can also additionally attained through the heat-radiating element 5a through 5c, and the substrate.

FIG. 4 shows another embodiment of the stack module in the present invention.

As shown in FIG. 4, the embodiment of the stack module comprises a plurality of stack modules 10-1, 10-2 and 10-3 mounted on a suitable substrate 50 which is a bottom portion of a hermetically sealed chamber 30, except for a rear end thereof.

Additionally, the chamber 30 is provided with a fan 40 driven by any suitable electrical motor or the like and which provides positive air flow into this chamber 30 through a suitable duct 45 so as to pass the air flow through each one of the heat-radiating element 5a through 5c of each one of the stack modules 10-1, 10-2 and 10-3 to thereby cool the heat-radiating element 5a through 5c, more effectively.

In the present invention, the heat-radiating element 5a through 5c is preferably made of copper.

Figure 5A:
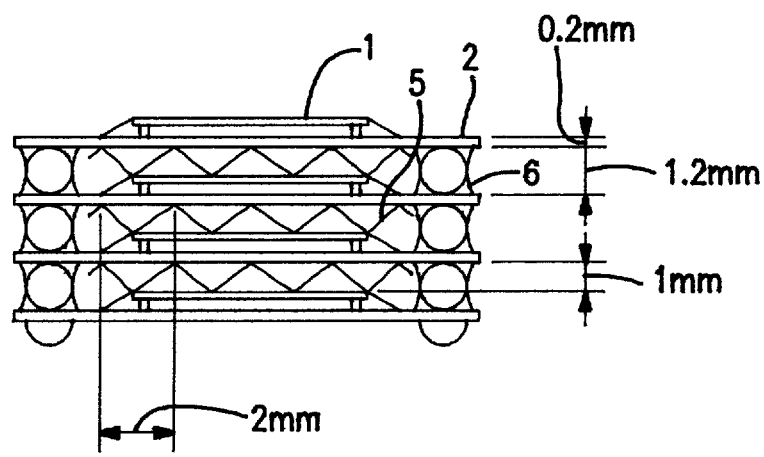
FIGS. 5(A), 5(B), 6(A) and 6(B) show practical embodiments of the present invention.
Figure 5B:
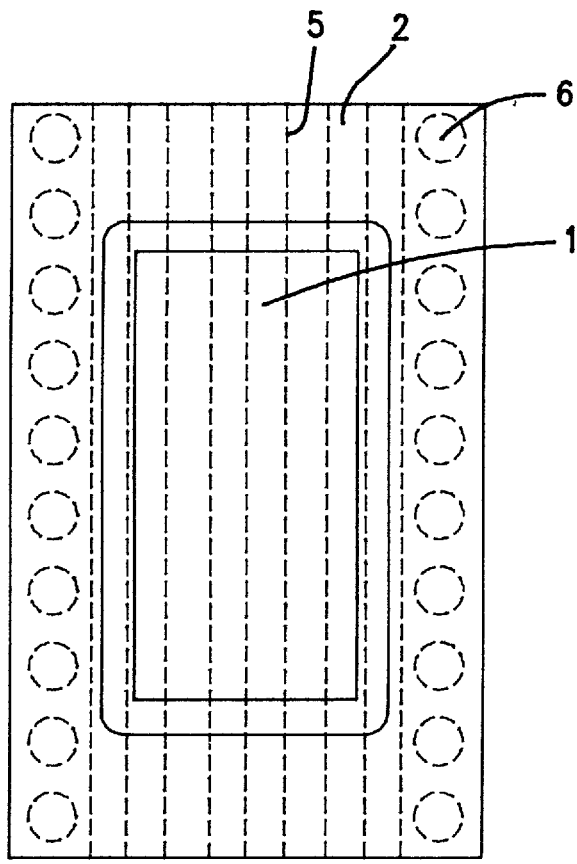

FIGS. 5(A) and 5(B) shows an one practical embodiment of the first aspect of the present invention and in that some dimensions of the stack module thereof are disclosed.

Next, the stack module of the second aspect of the present invention will be explained hereunder with reference to FIG. 2.

Figure 2:
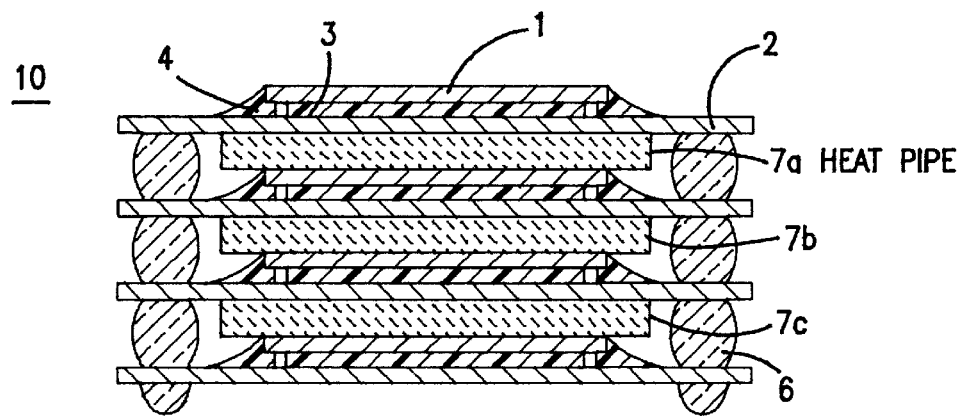
FIG. 2 is a cross-sectional view which shows the second embodiment of a stack module in the present invention.
Figure 3:
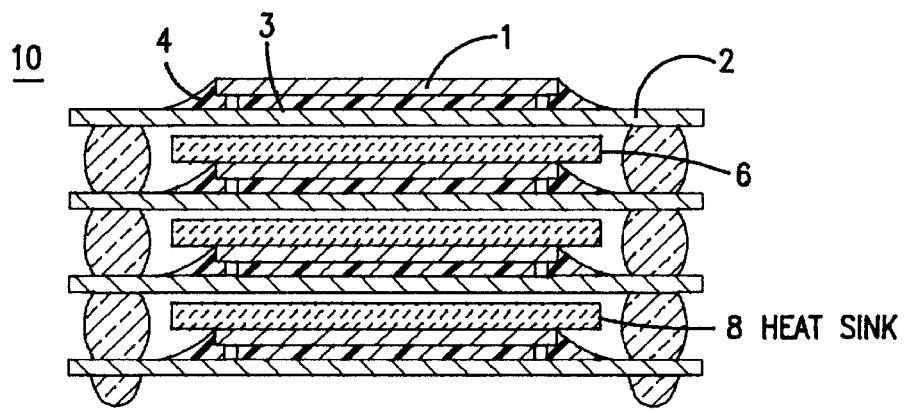
FIG. 3 is a cross-sectional view which shows an example of the related art.

FIG. 2 is a cross-sectional view of the second embodiment of the present invention and in that it is disclosed that a stack module 10 comprising a plurality of substrates 2 on a main surface of which at least one semiconductor chip 1 is mounted, and each one of the substrates 2 being stacked each other, one by one, the stack module 10 being provided with a heat pipe element 7a to 7c disposed between the semiconductor chip 1 and an adjacent substrate 2 arranged opposite to a surface of the semiconductor chip 1 so that the heat pipe element 7 contacts both the surface of the semiconductor chip 1 and the opposite surface of the adjacent substrate 2 to the semiconductor chip 1.

Note that in the stack module 10 which is shown in FIG. 2, heat pipes 7a through 7c are utilized in place of the heat-radiating elements 5a through 5c which are shown in FIG. 1.

Heat which is generated from the semiconductor chips 1 vaporizes the solvent of the heat pipes 7a through 7c, cooling being performed by the associated heat of vaporization, thus enabling efficient cooling in an environment in which air cooling is difficult, such as in a vacuum.

Regarding the heat pipe elements 7, any kinds of currently used heat pipe elements, for example, "Micro heat-Pipe" produced by Furukawa Denko Co., Ltd., can be used in the present invention.

Figure 6A:
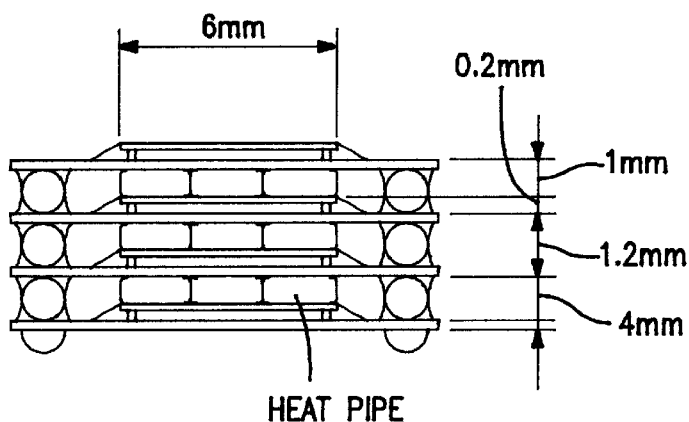
Figure 6B:
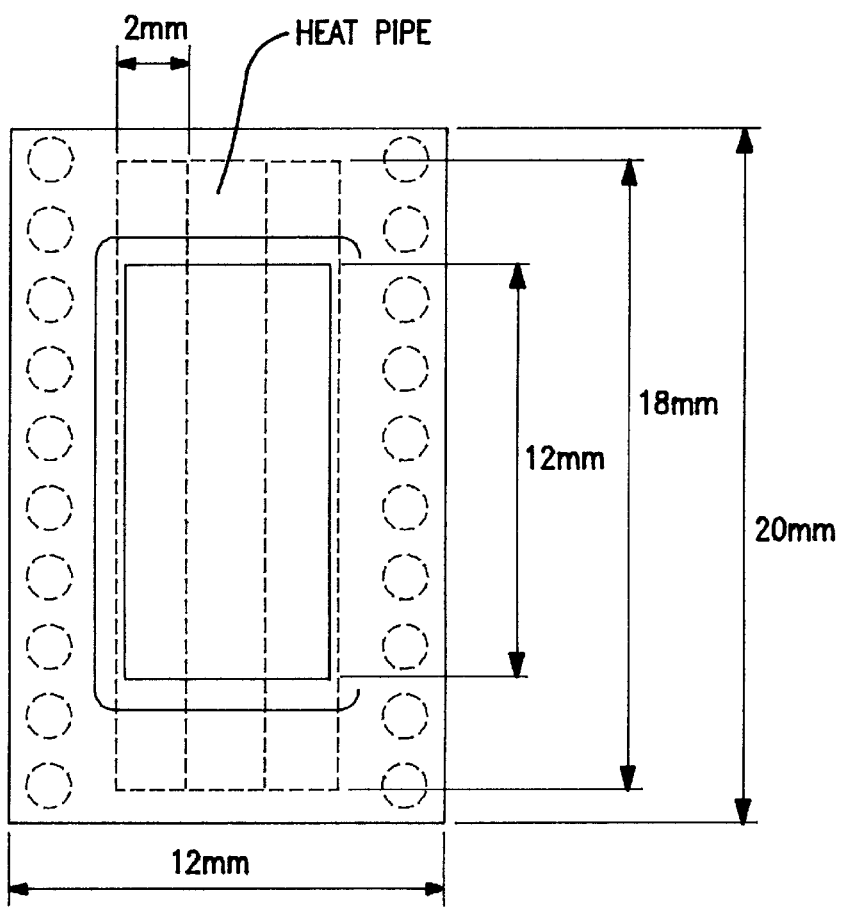

FIGS. 6(A) and 6(B) shows an one practical embodiment of the second aspect of the present invention and in that some dimensions of the stack module thereof are disclosed.

A second embodiment of the present invention is a stack module which has a heat pipe between a semiconductor chip which is flip-chip mounted on a substrate and the adjacent substrate.

Using the stack module having the technical constitution described above because a wave-shaped heat-radiating element or a heat pipe is used in place of a flat plate attached by adhesion to make contact with the location that generates heat, it is possible to achieve a long thermal cycle life without the generation of thermal stress.

What is claimed is:

1. A stack module comprising a plurality of substrates on a main surface of which at least one semiconductor chip is mounted, and each one of said substrates being stacked upon each other, one by one, said stack module being provided with a wave-shaped heat-radiating element disposed between said semiconductor chip and an adjacent substrate arranged opposite to a surface of said semiconductor chip so that said heat-radiating element contacts both said surface of said semiconductor chip and said opposite surface of said adjacent substrate to said semiconductor chip, said contact by heat-radiating element being established by spring elasticity of said heat-radiating element against said surface and said opposite surface so that an adhesive-free contact is provided which avoids thermal stress and provides a cushion effect to absorb stress.

2. A stack module according to claim 1, wherein said semiconductor chip is flip-chip mounted on said substrate.

3. A stack module comprising:
   a plurality of mounting substrates, onto each of which is mounted a semiconductor chips, stacked to each other utilizing substrate-connection bumps; and
   a heat-radiating element which is spring elastically disposed between and makes thermal contact with said semiconductor chip mounted on a first of said mounting substrates and a contact with said semiconductor chip mounted on a first of said mounting substrates and a rear surface of a second of said mounting substrates, making use of the elasticity of said heat-radiating element to maintain adhesive-free contact between said semiconductor chip and said rear surface.

4. A stack module according to claim 3, wherein heat-radiating element is wave-shaped.

5. A stack module according to claim 3, wherein said heat-radiating element is a made of copper.

6. A stack module according to claim 4, wherein said module being provided with an air blowing means so that positive air flows is formed through said heat-radiating element.

7. A stack module comprising a plurality of substrates on a main surface of which at least one semiconductor chip is mounted, and each one of said substrates being stacked upon each other, one by one, said stack module being provided with a heat pipe element frictionally disposed between said semiconductor chip and an adjacent substrate arranged opposite to a surface of said semiconductor chip so that said heat pipe element contacts both said surface of said semiconductor chip and said opposite surface of said adjacent substrate to said semiconductor chip in an adhesive-free manner.

* * * * *